United States Patent
Garabieta et al.

(10) Patent No.: US 9,448,258 B2
(45) Date of Patent: Sep. 20, 2016

(54) CURRENT SENSOR BASED ON A ROGOWSKI COIL

(71) Applicant: ARTECHE CENTRO DE TECNOLOGÍA, A.I.E., Munguia (Vizcaya) (ES)

(72) Inventors: Inaki Garabieta, Munguia (ES); Alfonso Montero, Munguia (ES)

(73) Assignee: ARTECHE CENTRO DE TECNOLOGÍA, A.I.E., Munguia (Vizcaya) (ES)

( * ) Notice: Subject to any disclaimer, the term of this patent is extended or adjusted under 35 U.S.C. 154(b) by 16 days.

(21) Appl. No.: 14/243,055

(22) Filed: Apr. 2, 2014

(65) Prior Publication Data

US 2014/0320111 A1   Oct. 30, 2014

(30) Foreign Application Priority Data

Apr. 2, 2013   (EP) .................................... 13382124

(51) Int. Cl.
*G01R 15/18* (2006.01)
*H05K 1/02* (2006.01)

(52) U.S. Cl.
CPC .......... *G01R 15/181* (2013.01); *H05K 1/0278* (2013.01)

(58) Field of Classification Search
None
See application file for complete search history.

(56) References Cited

U.S. PATENT DOCUMENTS

| | | | |
|---|---|---|---|
| 5,461,309 A | 10/1995 | Baudart | |
| 6,624,624 B1 * | 9/2003 | Karrer | G01R 15/181 324/117 R |
| 6,965,225 B2 * | 11/2005 | de Buda | G01R 15/186 324/117 R |
| 7,538,541 B2 * | 5/2009 | Kojovic | G01R 15/181 324/127 |
| 7,825,763 B2 | 11/2010 | Dupraz et al. | |

* cited by examiner

*Primary Examiner* — Minh H Tang
(74) *Attorney, Agent, or Firm* — Cantor Colburn LLP

(57) ABSTRACT

A current sensor based on a Rogowski coil includes a polygonal cross-section tube obtained from of one or more parts of rigid PCB. The windings that form the Rogowski coil are located on the portions of rigid PCB which form the flat faces of the polygonal cross-section tube. One or more parts of rigid PCB are joined together using flexible zones which can bend in the form of an l. The polygonal cross-section tube is designed so that, during its use, the conductor whose current is required to be measured is situated along the tube's longitudinal axis.

9 Claims, 4 Drawing Sheets

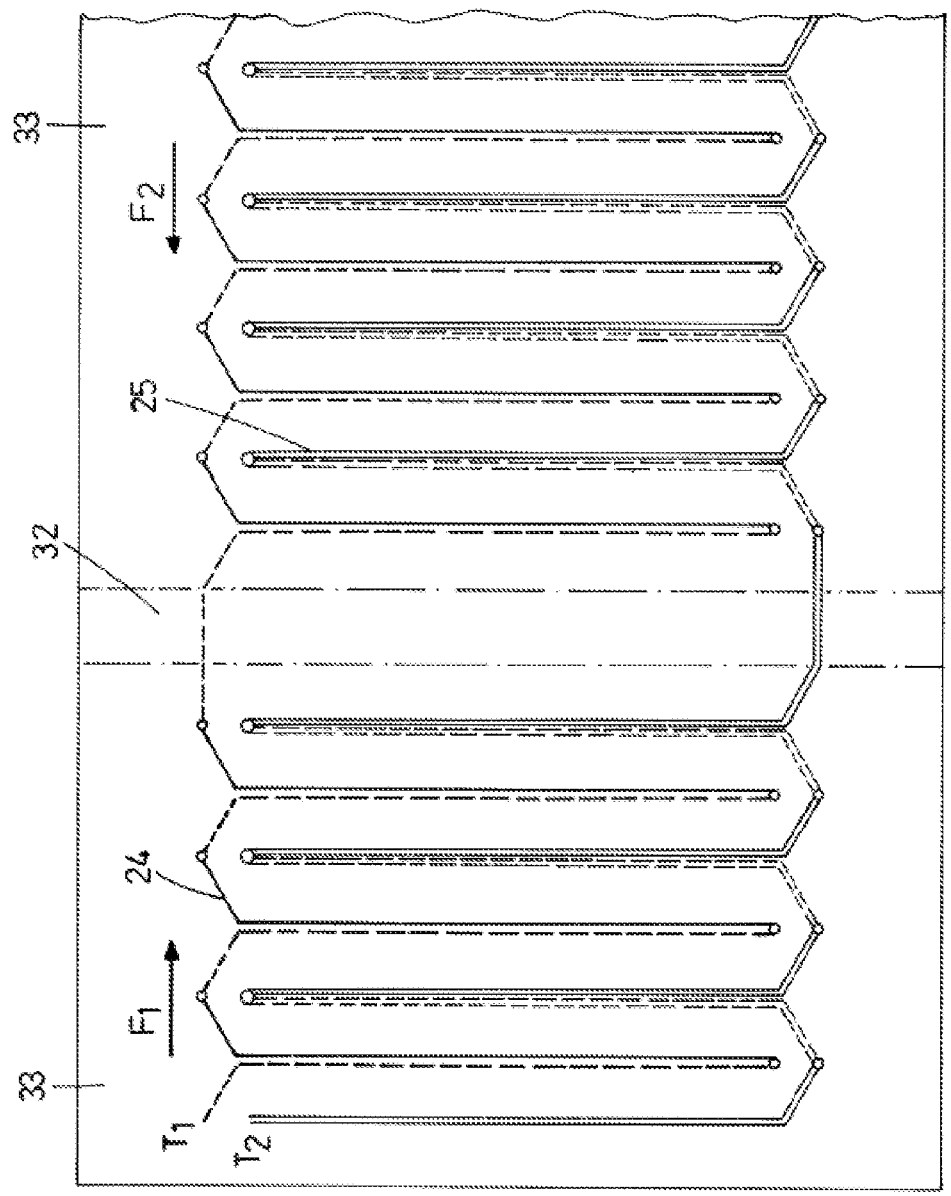

CURRENT SENSOR BASED ON A ROGOWSKI COIL

TECHNICAL FIELD

The present invention relates to the field of current sensors based on Rogowski coils and in particular to current sensors based on Rogowski coils embodied on a PCB support (Printed Circuit Board).

BACKGROUND OF THE INVENTION

There are various ways of manufacturing a Rogowski coil. A classical way involves winding the coil wire around a flexible (non magnetic) core. Another way involves "winding" the turns of wire around a hard core, such as a PCB. Thus, if both faces of the plate are used, each face has part of the circuit of each turn. In other words, the coil is implemented by means of metal deposits on each one of the board's two faces, extending along radii of the PCB. The result is a helical coil, whose cross-section is determined by the width of the coil and the thickness of the PCB.

One example of a Rogowski coil implemented on a PCB is the one disclosed in US patent document U.S. Pat. No. 5,461,309, which reveals a current measuring device based on a Rogowski coil implemented on a printed circuit board. The Rogowski coil has the shape of a flat disk, on which the coil is implemented by means of straight metal deposits on each side of the plate, along radii whose projections intersect in the central point of the coil. The electrical connections between the radii of one side and those of the opposite side are achieved by means of holes or paths that pass through the thickness of the board. These return coils in two different directions provide immunity against fields and currents that are external to the current to be measured. These coils are practically flat, which enormously facilitates their design and manufacture on PCB.

The type of Rogowski coil described for example in the preceding patent, is based on a flat circular structure (more specifically, ring-shaped) on a rigid PCB, wherein each winding (or turn of the coil) is positioned in a direction that is perpendicular to the conductor whose current is to be measured, as shown for example in FIG. 1 of U.S. Pat. No. 5,461,309. Consequently, these coils have a short length (measured in the direction of the conductor; in other words, their length coincides with the thickness of the PCB), have an inner diameter that is limited by the conductor and have an outer diameter that is conditioned by the coil's design. In other words, taking into account the limited freedom afforded by the thickness of the PCB and the inner diameter, the section of each winding is limited by the outer diameter of the PCB, which could be limited in the installation, thereby also limiting the coil section and its sensitivity for measuring the current.

US patent document U.S. Pat. No. 7,825,763B2 proposes an alternative design for a current transformer, wherein the transformer's secondary is formed by a complete tubular ring made up of four identical quarters of PCB, fixed to an annular frame. Each quarter of PCB is curved until completing an angular portion of a tubular ring whose axis of symmetry coincides with the axis of the transformer's primary conductor.

However, the above design requires several parts of PCB joined to each other mechanically and electrically, rendering manufacture more difficult and adding points of weakness to the design.

DESCRIPTION OF THE INVENTION

The present invention seeks to overcome the aforementioned drawbacks by means of a new current sensor based on a Rogowski coil and made on a PCB support.

Therefore, in a first aspect of the invention, a current sensor based on a Rogowski coil is provided which comprises a tube having a polygonal cross-section obtained from one or more pieces of rigid PCB that form flat faces of said tube having a polygonal section on which the windings that form the Rogowski coil are located, and in that the aforementioned flat faces are joined to each other by means of flexible zones which can be bent in a hinge-like manner in order to configure the said tube. The aforesaid polygonal cross-section tube is designed so that, during its use, the conductor wire carrying the current to be measured is situated along the tube's longitudinal axis.

The windings that form the Rogowski coil are made up of tracks on at least two rigid layers of the PCB and of paths that cross through the PCB and which can run in parallel or obliquely to the tube's longitudinal axis.

In a possible embodiment, the tube having a polygonal cross-section is implemented by means of a single piece of rigid PCB, wherein portions of PCB having a normal thickness and which constitute the flat faces of the tube alternate with portions of PCB having a reduced thickness allowing them to bend in the manner of hinges in order to constitute the flexible zones of the polygonal cross-section tube.

In a more particular embodiment, the portions of PCB having a reduced thickness do not occupy the entire length of the rigid PCB, and are rather implemented by means of at least one joining portion which acts in the form of a hinge. For example, an upper joining portion and a lower joining portion, in the middle of which there is a portion of rigid PCB which includes coil deposits.

In another possible embodiment, the tube having a polygonal cross-section is implemented by means of as many pieces of rigid PCB as the polygonal cross-section tube has faces, and each pair of parts of rigid PCB are joined together by means of portions of flexible PCB which allow bending in a hinge-like manner in order to constitute the flexible zones of the polygonal cross-section tube.

In another possible embodiment, the polygonal cross-section tube is implemented by means of both one piece of rigid PCB, wherein portions of PCB having a normal thickness alternate with portions of PCB having a reduced thickness allowing them to bend in the form of hinges in order to delimit the faces of the polygonal cross-section tube, and pieces of rigid PCB joined together by means of portions of flexible PCB that allow them to bend in the form of hinges in order to delimit the faces of the polygonal cross-section tube.

In another possible embodiment, the polygonal cross-section tube is implemented by means of two pieces of rigid PCB, on each one of which portions of rigid PCB alternate with flexible zones in the way of hinges in order to delimit the faces of the polygonal cross-section tube, wherein the rigid portion of one end of the first piece overlaps with the rigid portion of one end of the second piece, and the rigid portion of the opposite end of the first piece overlaps with the rigid portion of the opposite end of the second piece, the density of the windings of each of the overlapped portions being such that the sum of the windings of the two overlapping portions is equal to that of the non-overlapping portions.

BRIEF DESCRIPTION OF THE DRAWINGS

As a complement to the description and with a view to contributing towards an improved understanding of the characteristics of the invention, in accordance with an example of a practical embodiment thereof, a set of drawings is attached as an integral part of the description, which by way of illustration and not limitation, represents the following:

FIGS. 2A-2D show close-ups of a possible implementation of the invention.

DESCRIPTION OF AN EMBODIMENT OF THE INVENTION

Next a description is provided of several embodiments of the current sensor of the invention. The current sensor is three-dimensional and has a polygonal cross-section, in other words, it has the shape of a hollow tube with a polygonal cross-section. The conductor carrying the current to be measured coincides with the longitudinal axis of the "tube" (having a polygonal cross-section) which forms the sensor.

Figure 1:
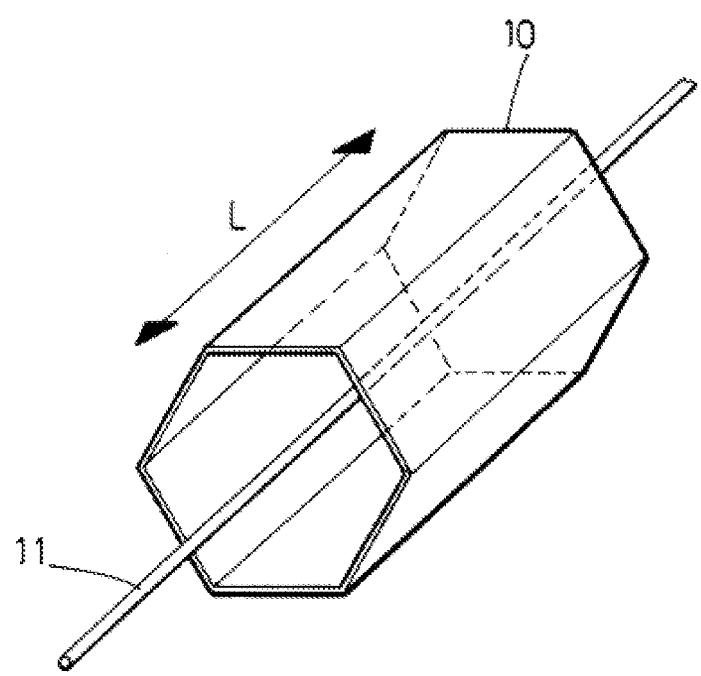
FIG. 1 shows an outline of the current sensor based on a Rogowski coil according to a possible embodiment of the invention.

FIG. 1 shows a sketch of a current sensor according to the invention, illustrating the primary conductor 11, through which the current to be measured circulates, and the secondary conductor 10, in the form of a Rogowski coil. The secondary conductor 10 is made up of a hollow tubular part having a polygonal cross-section made of printed circuit board (PCB), preferably of two or more layers, all or some of them being coiled. The axis of symmetry of this hollow part having a polygonal cross-section substantially coincides with the longitudinal axis of the primary conductor 11.

The substrate on which the printed circuit board or PCB is manufactured may be, for example and in a non-limiting manner, an epoxy resin, reinforced or not with glass fibre, a ceramic material or any other material having a very low thermal expansion coefficient.

The Rogowski coil is implemented by means of metal deposits or tracks on at least two layers of the plate (in the event of there being more than two layers, on at least the two outer faces), the electrical connections between the metal deposits on one face and those on the opposite face being established through holes or paths that cross through the thickness of the plate. The metal tracks may be straight, wavy or have a different shape. In other words, return coils in two different directions are formed. Unlike conventional Rogowski coils based on PCB, wherein the metal deposits are on a perpendicular plane to the longitudinal axis of the primary conductor 11, the metal deposits of the sensor of the invention are on the flat faces of the polygonal cross-section tube, these faces being parallel to the longitudinal axis of the primary conductor 11. On each face of the polygonal tube, the metal deposits may run parallel to the longitudinal axis or obliquely in relation thereto.

As can be seen from FIG. 2A the coil is formed by two tracks or metal deposits in series: a first deposit 24 in a clockwise direction, and a second deposit 25 in the anti-clockwise direction. FIG. 2A is a plan view of part the coil, wherein the first deposit 24 is illustrated in a continuous bold line when the deposit is on the visible face of the plate and in a broken and bold line when the deposit is on the opposite face; the second deposit 25 is illustrated as a double line, which is also continuous or broken depending on whether the deposit is on the visible face or on the opposite face. In the figure the two straight deposits of the same turn of the coil are shown next to each other only to facilitate understanding of the drawing. In reality, the two straight deposits of each turn are aligned with each other on opposite faces of the plate. Arrow F1 shows the direction of the coil of the first deposit 24 and arrow F2 shows the direction of the coil of the second deposit 25. The figure also shows the connection terminals or points T1 T2 (T1 is the connection point of the first deposit 24 and T2 is the connection point of the second deposit 25). In the sketch of FIG. 2A the deposits are straight, but as mentioned, in the current sensor of the invention this does not necessarily have to be the case.

In a possible embodiment, the current sensor is implemented by means of a single piece of rigid PCB, which includes portions having a reduced thickness (very thin), thanks to which they can bend in a hinge-like manner in order to constitute the corners of the polygon. One non-limiting example, which illustrates a piece of rigid PCB having a flexible part is the FR4 Semiflex® by Wurth. Normally, these reduced thickness zones do not withstand bending on multiple occasions, but this is not necessary either, given that the objective is to facilitate assembly and installation rather than to allow indiscriminate reuse.

Figure 2B:
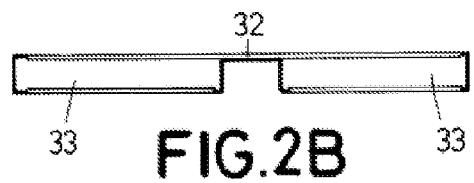
Figure 2C:
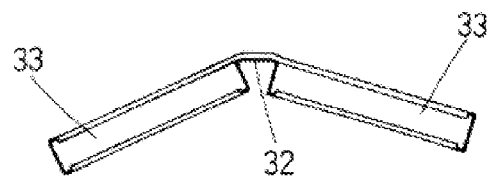
Figure 2D:
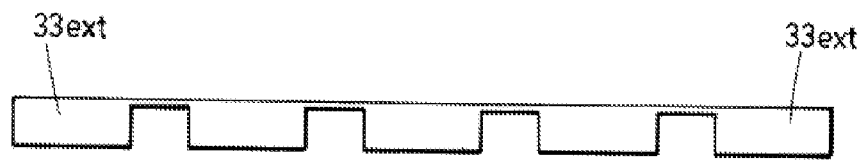

FIG. 2A shows a front view of the PCB plate on which a Rogowski coil is implemented according to this possible embodiment. The coil is deposited on the "normal" (not reduced) thickness zones 33 of the PCB. As already explained, this coil has one portion along one face (continuous line in FIG. 2A), crosses through the thickness of the PCB and returns along the other face (dotted line in FIG. 2A), crosses the PCB and continues in this manner constituting the windings. This coil is double, in other words, it advances in one direction and when it reaches the end of the PCB, it returns once more producing more windings (outwards and return), as explained according to FIG. 2A. The coil is made in the zone having a normal thickness, while in the weakened or reduced thickness zones 32 there is only one track that passes to the next portion of normal thickness 33, where the coil continues. As explained in FIG. 2A, there is a wire (metal deposit) for the outward coil and another for the return coil. FIG. 2B shows a cross-section of the previous plate, where it is possible to see the thickness of the zones with a normal thickness 33 and the zone with a reduced thickness 32. FIG. 2C shows the plate of FIG. 2B once it has been bent along the zone of reduced thickness 32. By repeating on the same plate of rigid PCB this operation of alternating portions having a normal thickness with portions having a reduced thickness (as illustrated in FIG. 2D), and bending the aforesaid zones of reduced thickness, the formation of a polygonal cross-section tube is achieved having as many faces as portions of rigid PCB have been used. This PCB is mechanically fastened using any possible means, for example on a tubular polygonal support, to leave the definitive shape of the coil completed. From an electrical point of view the two connections (input and output) are together (points T1 and T2 of FIG. 2) on the same side of the polygonal tube. These connectors will be connected to whatever is necessary in order to carry out the relevant measurements. The conductor carrying the current to be measured circulates along the longitudinal axis of the tube.

Figure 3:
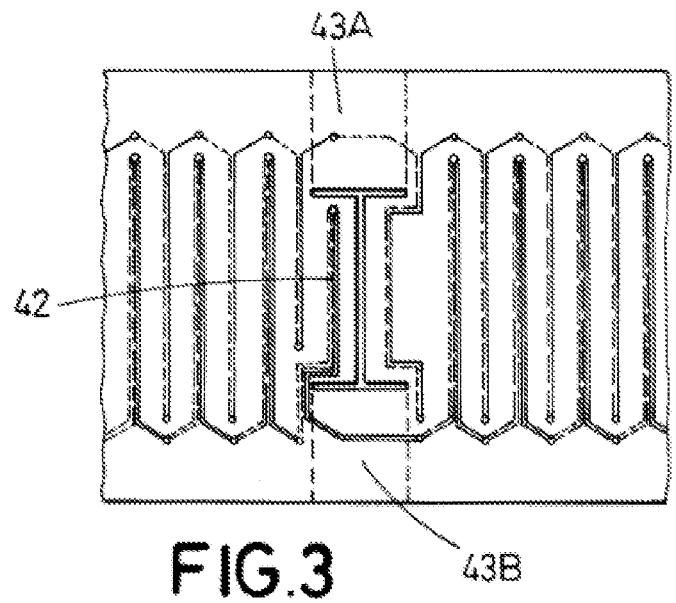
FIG. 3 shows a portion of rigid PCB wherein the thickness of one part has been reduced until it has become flexible.

FIG. 3 shows a more particular embodiment, wherein a portion of rigid PCB 42 has had its thickness reduced in one part until it has become flexible 43-A 43-B. As can be seen, the hinge zones (zone of reduced thickness PCB) 43-A 43-B do not have to be continuous from top to bottom, in other words, they do not have to occupy the entire length of the rigid PCB. It is only necessary for them to have a joining portion between two rigid parts that allows the passing of the wire, the rest can be left to air. Therefore, in the embodiment of FIG. 3, the zone designed to act as a hinge (reduced thickness PCB) 43-A 43-B is minimised, making it possible to increase the coiled surface. This optimises the space on which to coil, without leaving rigid PCB unused to implement hinges. As can be seen, the figure also illustrates the coil deposits on the rigid part (without a reduced thickness) situated between the zones of reduced thickness PCB 43-A 43-B.

Figure 4:
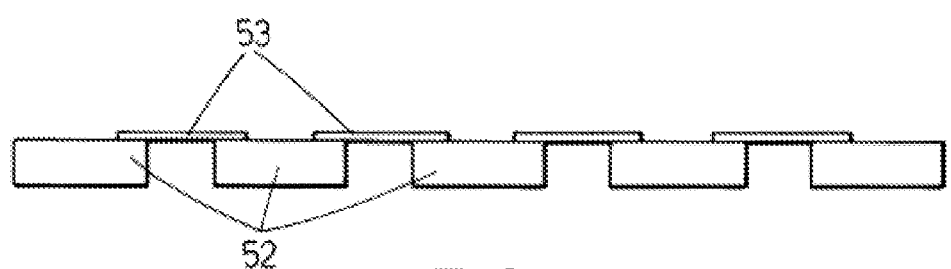
FIG. 4 shows an alternative implementation of the invention.

Alternatively, the weakened or reduced thickness parts, instead of being embodied on the same piece of rigid PCB, are embodied with a flexible PCB (fPCB) 53 joining the normal thickness portions of PCB 52, as shown in the sketch of FIG. 4. In other words, the parts of flexible PCB can be either separate elements that are joined to the rigid PCB, or pieces of flexible PCB integrated in the rigid PCB by the manufacturer.

In all embodiments (FIGS. 2D, 3 and 4) a coil is formed having a tubular shape through a combination of rigid PCB with flexible zones that can be made of one single piece or several pieces.

In another possible embodiment, in one same sensor in the same polygonal tube there is a combination of hinges made of rigid PCB with a reduced thickness, and hinges made of pieces of fPCB. In other words, not all the hinges need to be of the same type, rather the two can be present in the same sensor.

Figure 5:
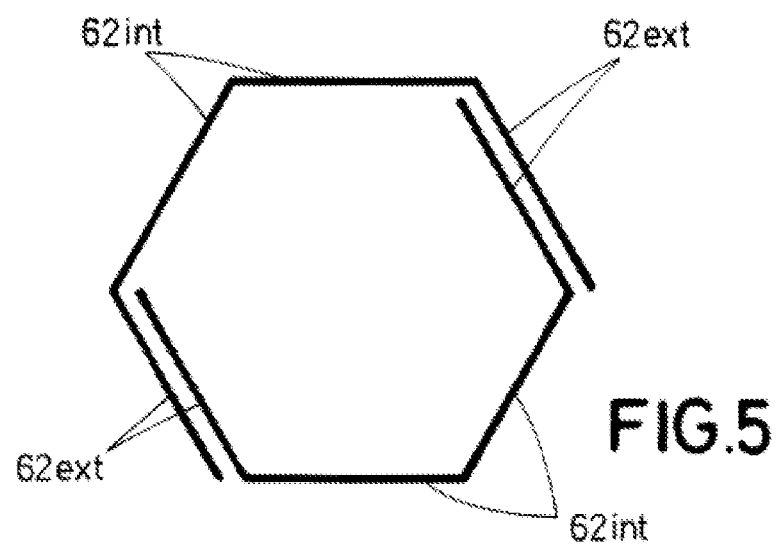
FIG. 5 shows an outline of a current sensor based on a Rogowski coil in accordance with another possible embodiment of the invention.

FIG. 5 shows an alternative embodiment, wherein the polygon (cross-section of the polyhedric tube manufactured in PCB), instead of being configured on the basis of a single element of rigid PCB, is embodied on the basis of two rigid PCB elements (such as the ones described previously in FIGS. 2A-2D). In this case, when the portions of PCB having a reduced thickness 32 are bent to form the polygonal cross-section tube, the two last portions of normal thickness of the first element of PCB ($33_{ext}$ in FIG. 2D and $62_{ext}$ in FIG. 5), overlap with the last two portions of the second element. Note that the density of the windings in the portions that overlap $62_{ext}$ is such that the sum of the windings on the overlapping portions is equal to that of the portions that are not left overlapping $62_{int}$. In other words, the complete circuit travels more than 360°. Due to the fact that it is made up of two independent portions of PCB, this configuration provides the benefit of the current sensor being very easy to open and, consequently, can be easily coupled or uncoupled around the tension wire.

In this case, the connection terminals of each element are appropriately connected, either through electrical connections between the two pieces, or by taking a wire from each part to an external junction box, or in any other way considered appropriate by a person skilled in the art.

In both the case of the sensor implemented on the basis of a rigid PCB or plate, or two plates of rigid PCB, the dimensions of the sensor exceed very little in diameter in respect of the diameter of the primary conductor 11, meaning that spaces are reduced and to the same extent the sensitivity of the Rogowski coil increases. In other words, with the new design, and adapting the coil to a polyhedric tubular shape (having a polygonal cross-section), and given an inner diameter set by the conductor wire 11, and with an outer diameter exceeding the inner diameter by very little, the length (measured in the direction of the conductor) is achieved as the free dimension for the design. This length is expressed in FIG. 1 with reference L.

In any of the cases, the polyhedric tube can have as many faces as required, in other words, the polygon that determined the tube's cross-section may be an equilateral triangle, a square, a pentagon, a hexagon, etc.

Additionally, with the proposed technology two types of sensors can be manufactured: closed sensors wherein the flexibility of the PCB (whether one piece of rigid PCB or two pieces of rigid PCB having joints with half-density of windings, reduced in thickness in some zones to allow bending thereof) is used to facilitate manufacture and stability of the sensor, but in their application cannot be opened. Or sensors that can be opened which facilitate their installation on field, taking into account the sensor's capacity to open and close on itself taking advantage of the flexibility thereof.

In this text, the word "comprises" and its variants (such as "comprising", etc.) must not be interpreted in an excluding manner, in other words do not exclude the possibility of what is being described including other elements, steps, etc.

At the same time, the invention is not limited to the specified embodiments described and also encompasses, for example, variants that can be embodied by an average person skilled in the art (for example, with regard to the choice of materials, dimensions, components, configuration, etc.), within the scope of what is inferred from the claims.

The invention claimed is:

1. A current sensor based on a Rogowski coil comprising a polygonal cross-section tube obtained from one or more pieces of rigid printed circuit board (PCB) which form flat faces of said polygonal cross-section tube where the windings that form the Rogowski coil are located, the current sensor wherein said flat faces are joined together by means of flexible zones of printed circuit board (PCB) that bend in a hinge-like manner to form the tube, said polygonal cross-section tube being designed so that, during its use, the conductor whose current is to be measured is situated along the tube's longitudinal axis.

2. The sensor of claim 1, wherein said windings that form the Rogowski coil are made up of tracks on at least two faces of the rigid printed circuit board (PCB) and paths that cross through the printed circuit board (PCB), and wherein said windings run parallel to the longitudinal axis of the tube.

3. The sensor of claim 1, wherein said windings that form the Rogowski coil are made up of tracks on at least two faces of the rigid printed circuit board (PCB) and paths that cross through the printed circuit board (PCB), and wherein said windings run obliquely in respect of the longitudinal axis of the tube.

4. The sensor of claim 1, wherein said polygonal cross-section tube is implemented by means of a single piece of rigid printing circuit board (PCB), in which portions of normal thickness printed circuit board (PCB) which constitute the flat faces of the tube alternate with portions of reduced thickness printed circuit board (PCB) which are bent in a hinge-like manner in order to constitute the flexible zones of the polygonal cross-section tube.

5. The sensor of claim 4, wherein said portions of reduced thickness printed circuit board (PCB) do not occupy the entire length of the rigid printed circuit board (PCB), and are rather implemented by means of at least one joining portion that acts in a hinge-like manner.

6. The sensor of claim 5, wherein said portions of reduced thickness printed circuit board (PCB) do not occupy the entire length of the rigid printed circuit board (PCB), and are rather implemented by means of a top joining portion and a bottom joining portion, in the middle of which there is a portion of rigid printed circuit board (PCB) which includes windings of the coil.

7. The sensor of claim 1, wherein said polygonal cross-section tube is implemented by means of as many pieces of rigid printed circuit board (PCB) as the polygonal cross-section tube has faces, and wherein each pair of pieces of rigid printed circuit board (PCB) are joined to each other by means of portions of flexible printed circuit board (PCB) that are bent in the form of hinges in order to constitute the flexible zones of the polygonal cross-section tube.

8. The sensor of claim 1, wherein said polygonal cross-section tube is implemented by means of both a piece of rigid printed circuit board (PCB), in which portions of normal thickness printed circuit board (PCB) alternate with portions of reduced thickness printed circuit board (PCB) that are bent in a hinge-like manner in order to form the flexible zones of the polygonal cross-section tube, and pieces of rigid printed circuit board (PCB) joined to each other by means of portions of flexible printed circuit board (PCB) which are bent in a hinge-like manner in order to form the flexible zones of the polygonal cross-section tube.

9. The sensor of claim 1, wherein said polygonal cross-section tube is implemented by means of two pieces of rigid printed circuit board (PCB), on each of which portions of rigid printed circuit board (PCB) alternate with flexible zones in a hinge-like manner in order to delimit the faces of the polygonal cross-section tube, wherein the rigid portion of one end of the first piece overlaps with the rigid portion of one end of the second piece, and the rigid portion of the opposite end of the first piece overlaps with the rigid portion of the opposite end of the second piece, the density of the windings of each one of the overlapping portions being such that the sum of the windings of the two overlapping portions is equal to that of the non-overlapping portions.

* * * * *